United States Patent
Wan

(10) Patent No.: US 8,591,648 B2
(45) Date of Patent: Nov. 26, 2013

(54) CRYSTAL GROWING SYSTEM HAVING MULTIPLE ROTATABLE CRUCIBLES AND USING A TEMPERATURE GRADIENT METHOD

(76) Inventor: Youbao Wan, Jiaxing (CN)

(*) Notice: Subject to any disclaimer, the term of this patent is extended or adjusted under 35 U.S.C. 154(b) by 926 days.

(21) Appl. No.: 12/448,683

(22) PCT Filed: Dec. 27, 2007

(86) PCT No.: PCT/CN2007/003853
§ 371 (c)(1),
(2), (4) Date: Mar. 15, 2010

(87) PCT Pub. No.: WO2008/086705
PCT Pub. Date: Jul. 24, 2008

(65) Prior Publication Data
US 2010/0294198 A1  Nov. 25, 2010

(30) Foreign Application Priority Data
Dec. 29, 2006  (CN) .......................... 2006 1 0148317

(51) Int. Cl.
C30B 11/00  (2006.01)

(52) U.S. Cl.
USPC .................. 117/81; 117/79; 117/82; 117/83; 117/220

(58) Field of Classification Search
USPC ........................... 117/81, 82, 83, 179, 220, 79
See application file for complete search history.

(56) References Cited

U.S. PATENT DOCUMENTS

| | | |
|---|---|---|
| 5,944,892 A | 8/1999 | Li |
| 6,241,820 B1 | 6/2001 | Ohuchi et al. |
| 6,368,407 B2 | 4/2002 | Ohuchi et al. |
| 6,428,617 B1 | 8/2002 | Sakuragi et al. |
| 6,645,294 B2 | 11/2003 | Lan et al. |
| 7,344,598 B2 | 3/2008 | Lan et al. |
| 2012/0282133 A1 | 11/2012 | Elliot et al. |
| 2012/0312800 A1 | 12/2012 | Chartier et al. |

FOREIGN PATENT DOCUMENTS

CN  200610148317  *  8/2007

* cited by examiner

Primary Examiner — Bob M Kunemund

(57) ABSTRACT

A crystal growing system having multiple rotatable crucibles and using a temperature gradient method comprises a crystal furnace, a plurality of crucibles, a supporting device, and a temperature control device. The crystal furnace includes a furnace body, a heater, and a hearth, wherein the furnace body from outer to inner includes an outer shell, a fiber insulation layer, an insulation brick layer, and a refractory layer. The crucible supporting device includes an elevator, a plurality of crucible guiding tubes, and a plurality of tube holders each capable of supporting a crucible guiding tube, a moving device that is connected to the elevator, a motor with electrical power that is connected to the moving device, wherein there is an affixing device between each pair of guiding tube and guiding tube holder. Each crucible is located in a corresponding crucible guiding tube. The crucible supporting device is a rotatable device. The refractory layer is $2/3$-$5/6$ of the total height of the hearth, and the heater, is located at $1/4$-$1/2$ of the height of the hearth. The present invention promotes doping of crystal and makes doping more uniform.

4 Claims, 1 Drawing Sheet

CRYSTAL GROWING SYSTEM HAVING MULTIPLE ROTATABLE CRUCIBLES AND USING A TEMPERATURE GRADIENT METHOD

FIELD OF THE INVENTION

The present invention relates to crystal growing, and more particularly to a crystal growing system having multiple rotatable crucibles and using a temperature gradient method.

BACKGROUND TECHNOLOGIES

Chinese Patent No. 200420082546.8 describes a crystal growing device that can effectively grow a single crystal using a dual heating temperature gradient method. Similar to the traditional temperature gradient method, during the crystal growing process a heater is located at partial height of a crucible, and gradual crystal growth is achieved through moving the heater at a proper speed. This type of method is effective in growing a single crystal, but cannot be used to realize the growth of multiple crystals simultaneously.

In prior art multiple crucible crystal growing technologies, a crystal growing system generally employs a Bridgman method. This type of system elongates the hearth of the furnace in one direction, so that the hearth can house multiple growing crystals. The near rectangular temperature field formed in the elongated direction under the condition has achieved initial success of growing lead tungstate crystal that has a square outer appearance. In this type of Bridgman crystal growing system, the high temperature zone in the hearth is usually the whole chamber area above the crystal growing point, and the crystal growing material and doping agent are in molten state. When growing a crystal with a doping agent such as $La_2O_3$ that has high melting point and low volatility, the space above the solid part that is preformed or formed due to volume reduction from growing polycrystalline raw materials to single crystal product has no apparent effect on crystal growth. On the other hand, when growing with a doping agent that has low melting point and high volatility, such as $PbF_2$, the doping agent can severely evaporate into the space above, causing doping almost impossible to realize. In prior art multiple crucible Bridgman crystal technologies, the crucible supporting device in a crystal growing system, such as that grows lead tungstate crystal, $Sb_2O_3$ doped lead tungstate crystal, or $Nb_2O_5$ doped lead tungstate crystal, is controlled by automated equipment and can cause crucibles to move downward to realize crystal growing according to requirements. However, this type of crystal growing crucible supporting device can only cause the crystal growing crucibles to move up and down. During the crystal growing process the melt and the crystal are at rest with each other, only natural convection and dissipation occur in the melt. The primary driving force for crystal growing, therefore, is particle concentration gradient, temperature gradient in the melt and gravity. Because natural convection and dissipation are the only vehicles to move the growing particles, particle transfer rate in the melt is slow and efficiency is not high. When growing a crystal that has simple components, similar component ion effective segregation coefficients, crystal composition at the growing interface similar to the melt composition, particle transfer in the melt is not very important. And the prior art Bridgman system can do the job. When growing a crystal that has more complex components, crystal composition at the growing interface relatively different from the melt composition, and clearly different component ion effective segregation coefficients, insufficient particle transfer ability in the melt causes the particles that are needed for crystal growing not able to get to the interface and those particles that are not needed at the interface, for example, impurity, not able to transfer into the melt instead to accumulate in at the interface. When concentration of the unwanted particles gets too high, impurity or even a secondary phase can form in the crystal. It can cause the crystal to have too many defects, even severe defects such as secondary phase inclusion. Or, it may cause severe consequences such as inconsistent doping agent ion distribution in the doped crystal—unacceptable for crystal quality.

In a multiple crucible Bridgman system the near rectangular hearth can hold a few and even up to tens of growing crystals simultaneously, realizing the purpose of multiple crucible crystal growing. The heater located at the hearth wall can satisfy the heating requirement of crystal growing. The near rectangular and asymmetrical temperature field in the length direction is suitable for growing crystal that has a square outer profile. The whole growing process is very quiet. And the system is beneficial to growing crystals that have low requirements for particle transfer in the melt, and with components or doping ions having similar effective segregation coefficients. It is not beneficial to growing round crystals. The system is characterized by the melt and the crystal at rest with each other during the whole growing process, lack of forced convection, and low solvent transfer rate. It is not beneficial for growing crystals that have big difference between component ion effective segregation coefficients.

CONTENT OF THE INVENTION

The main technical problem the present invention is trying to resolve is to provide a crystal growing system using a temperature gradient method to achieve enhanced and uniform doping.

The present invention adopts the following schemes:

A crystal growing system having multiple rotatable crucibles and using a temperature gradient method comprises a furnace body, a plurality of crucibles and an associated supporting device, and a temperature control device, wherein the furnace includes a furnace body, a heater and a hearth, wherein the furnace body from outer to inner includes an outer shell, a fiber insulation layer, an insulation brick layer, and a refractory layer. The crucible supporting device includes an elevator, a plurality of crucible guiding tubes, and a plurality of holders residing on the elevator and each capable of supporting a crucible guiding tube, a moving device that is connected to the elevator, a motor with electrical power that is connected to the moving device, wherein there is an affixing device between each pair of guiding tube and guiding tube holder, and wherein the crucibles are placed in the guiding tubes, respectively. The crucible supporting device is capable of rotating multiple crucibles. At the lower end of each guiding tube supporting device is connected to a rotating shaft which runs through the elevator. At the lower ends of the multiple rotating shafts are connected to gears engaged with each other. One of the multiple rotating shafts is longer than the rest, and is engaged with a motor affixed to the elevator through a shaft coupling. The height of the refractory layer is $2/3$-$5/6$ of the total height of the hearth, and the heater is located at $1/4$-$1/2$ of the height of the hearth.

When applying the present invention in practice, because the heater is located $1/4$-$1/2$ of the hearth height and the refractory layer height is only $2/3$-$5/6$ of the height of the hearth, there is leftover space, thus forming four temperature zones along the central vertical axis of the crystal hearth. From top to bottom, the 4 zones are the $1^{st}$ temperature zone, the $2^{nd}$ temperature zone, the 3$^{rd}$ temperature zone, and the 4$^{th}$ temperature zone, respectively. When the crucibles are placed in the hearth to grow crystals, the raw material in the 1$^{st}$ temperature zone is not melted; and the raw material in the 2$^{nd}$ temperature zone is being melted. The boundary of the 1$^{st}$ temperature zone and the 2$^{nd}$ temperature zone is corresponding to the melting point of the raw material. Temperature in the 3$^{rd}$ temperature zone is below the melting point, and material there is being crystallized. Temperature at the boundary between the 2$^{nd}$ temperature zone and the 3$^{rd}$ temperature zone is the crystallization temperature. Temperature gradient in the 3$^{rd}$ temperature zone is big, able to provide the driving force for crystallization to happen. At the bottom is the 4$^{th}$ temperature zone that has lower temperature, reaching to room temperature toward the lowest end. In this area crystal is fully grown.

During the crystal growing process, a portion of the raw material in the crucible is melted. The part of material that is at the top of the crucible is not melted and is in solid state. This part of material can form a solid seal to prevent or impede the evaporation of volatile gas from the melt below. Therefore, the melt is protected so that off-chemical-ratio evaporation of the components won't cause the component composition in the melt to deviate from the ratio required for crystal growing. The adoption of the rotatable multiple crucible supporting device makes it possible to adjust the rotation speed and direction according to requirements during crystal growing. Therefore, the crucibles in the guiding tubes can go through accelerated rotation following certain sequences. During the growing process, the grown solid crystal and the crucible wall is mechanical brought along by the turning guiding tube that follows the rotation of the motor. The effect of inertia causes the liquid state melt to move relatively against the crystal and the crucible wall, a stirring effect similar to that of the Czochralski method. The forced convection produced greatly enhances mass transfer in the melt. Therefore, at the crystal growing interface particle exchange between the growing crystal and the melt is improved: the growing crystal gets particles in need and timely repels those particles not needed into the melt. The end result is enhanced crystal integrity and improved crystal quality.

Although it can house multiple and even up to tens of crucibles for crystal growing, the furnace in the present invention has a rectangular hearth, similar to that of a vertical multiple crucible growing system. The crucible guiding tubes are continuously turning during crystal growing. And there is a good insulation layer between the crucible and the guiding tube to reduce the effect of the guiding tube temperature change on the temperature field inside the crucible. Therefore, the cross-sectional temperature field in each growing crucible is circular and symmetrical. Temperature gradient is the main driving force for crystal growing. A symmetrical temperature field in the radial direction is beneficial to maintaining the radial symmetry of the solid-to-liquid interface during growing: crystal growing is getting similar driving force in all directions, and crystal quality is greatly improved. Application of the present invention can produce a crystal with a melt that has relatively complex components, or with certain difference between component ion effective segregation coefficients, or doped crystal. It can also be used to grow circular crystals that cannot come from prior art Bridgman techniques.

The present invention has the following benefits: The multiple crucible crystal growing system using a temperature gradient method of the present invention effectively causes a polycrystalline material solid seal formed on top of the melt inside the growing crucible, preventing the evaporation of the volatile components in the melt. The system is suitable not only for growing crystals doped with volatile doping agent, but also for growing crystals doped with non-volatile doping agent. Also, the rotatable crucible and its guiding tube form radial symmetrical temperature field. Therefore, the adoption of the present invention can effectively enhance the quality of the growing crystal, and can grow high quality doped crystal. It can also grow round crystals that are difficult to produce from prior art multiple crucible Bridgman technologies.

ACTUAL PRACTICE OF THE INVENTION

The following explanation is in combination with the drawings.

Figure 1:
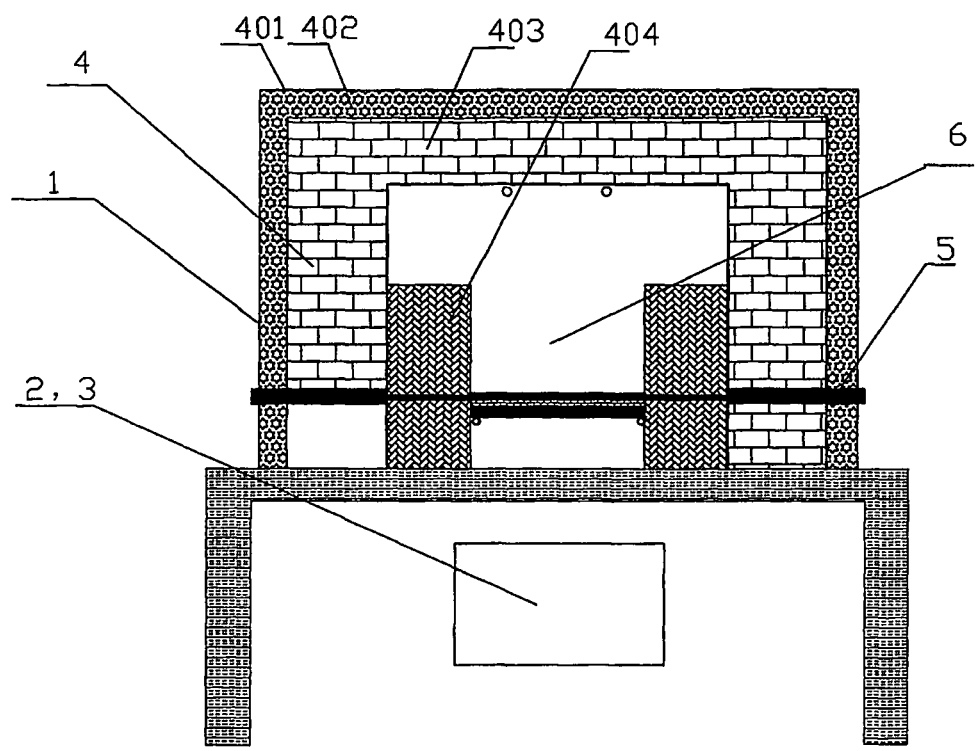
FIG. 1 is a structural schematic of the present invention.
Figure 2:
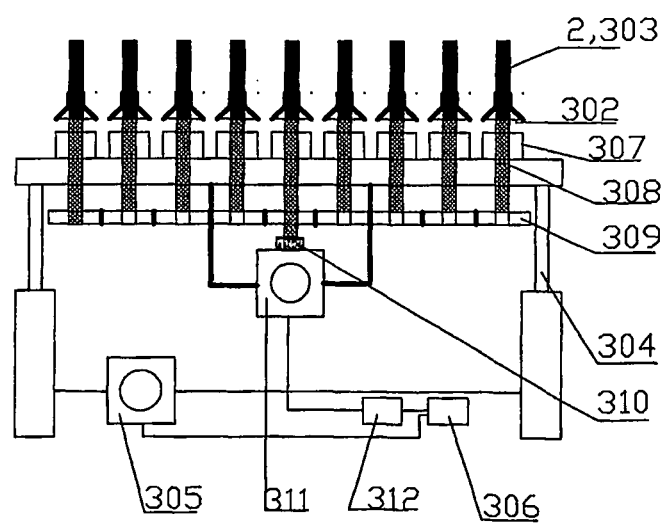
FIG. 2 is the partial view of crucible and the supporting device.

The multiple rotatable crucible crystal growing system using a temperature gradient method, as shown in FIG. 1 and FIG. 2, comprises a crystal furnace 1, a plurality of crucibles 2, and a supporting device 3, wherein crystal furnace 1 includes a furnace body 4, a heater 5 and a hearth 6. Furnace body 4 from outer to inner includes an outer shell 401, a fiber insulation layer 402, an insulation brick layer 403, and a refractory layer 404. Crucible supporting device 3 includes elevator 301, a plurality of crucible guiding tube holders 302 and a plurality of crucible guiding tubes 303 that reside on elevator 301, a moving device 304 that is connected to the elevator 301, a motor 305 with electrical power 306 that is connected to moving device 304, wherein there is an affixing device 307 between each pair of guiding tube holder 302 and guiding tube 303. Each crucible 2 is located in a crucible guiding tube 303.

Crucible supporting device 3 is a rotatable device. The lower end of each crucible guiding tube holder 302 is connected to a rotating shaft 308 that penetrates through elevator 301. At the lower end of each rotating shaft 308 that comes out of the lower surface of elevator 301 is attached a gear 309 engaging with the neighboring gears. One of the rotating shafts is longer than the rest and is positioned in the middle. Gear 309 on the longer shaft is connected to a motor 311 that is affixed to the elevator through a shaft coupling 310. The height of refractory layer 404 is ⅔ the total height of hearth 6. Heater 5 is positioned at ¼ height of hearth 6. To effectively control rotation speed and direction during crystal growing, in the present invention a digital frequency converter 213 is connected between motor 311 and electrical power 306. In practice, the height of refractory layer 404 can be ¾ or ⅚ the hearth total height, and heater 5 can be placed ⅜ or ½ height of hearth 6. The heater can be replaced with different types according to the melting point or crystallization temperature of different crystals, to satisfy growing different crystals and doped crystals and their requirements.

However, in practical application, the introduction of rotatable crucible supporting device into crystal growing may have negative effects. A rotating guiding tube can cause air flow in the hearth. The faster the rotating speed, the more obvious the effect is. Both the air flow and the rotating guiding tube can have influence on the temperature field in the hearth. The influence is especially big on the isothermal planes in the length direction of the hearth. And the air flow around the surface of the guiding tube increases heat transfer to the guiding tube. These influences can change the temperature distribution in the crucible, hence influencing the radial symmetry of the growing solid-to-liquid interface. As the rotating speed of the guiding tube is reduced, these influences reduce rapidly. The harmful influences can also be reduced by increasing the thickness of the insulation layer in the guiding tube.

The invention claimed is:

1. A crystal growing system having multiple rotatable crucibles and using a temperature gradient method, comprising:
   a crystal furnace;
   a plurality of crucibles;
   an supporting device; and
   wherein the furnace includes a furnace body, a heater, and a hearth, wherein the furnace body from outer to inner includes an outer shell, a fiber insulation layer, an insulation brick layer, and a refractory layer;
   wherein the supporting device includes an elevator, a plurality of crucible guiding tubes, and a plurality of holders each capable of supporting a crucible guiding tube, a moving device that is connected to the elevator, a motor with electrical power that is connected to the moving device, wherein there is an affixing device between each pair of guiding tube and guiding tube holder;
   where in each crucible is located in a corresponding crucible guiding tube; and
   wherein the characteristics are the supporting device is a multiple rotatable crucible supporting device, that there is a rotating shaft attached to the lower part of each guiding tube holder, that rotating shafts penetrating through the elevator, that there are gear connections at the lower portions of the rotating shafts coming out of the elevator, that one of the shafts is longer than to other and the longer shaft is connected through its gear and shaft coupling to the motor that is affixed to the elevator; that the height of the refractory layer is $2/3$-$5/6$ of the total height of the hearth, and the heater is located at $1/4$-$1/2$ of the height of the hearth.

2. A crystal growing system having multiple rotatable crucibles and using a temperature gradient method as recited in claim 1 wherein:
   the longer shaft of rotatable crucible supporting device is located in about the central position of the shafts.

3. A crystal growing system having multiple rotatable crucibles and using a temperature gradient method as recited in claim 1 wherein:
   the heater is able to be replaced according to the requirements for growing difference crystals.

4. A crystal growing system having multiple rotatable crucibles and using a temperature gradient method as recited in claim 1 wherein:
   there is a digital speed controller located between the motor of the multiple rotatable crucible supporting device and the electrical power.

* * * * *